(12) United States Patent
Hong

(10) Patent No.: US 9,411,020 B2
(45) Date of Patent: Aug. 9, 2016

(54) BATTERY PACK AND METHOD OF CONTROLLING THE SAME

(75) Inventor: Seong-Pyo Hong, Yongin-si (KR)

(73) Assignee: Samsung SDI Co., Ltd., Gyeonggi-Do (KR)

( * ) Notice: Subject to any disclaimer, the term of this patent is extended or adjusted under 35 U.S.C. 154(b) by 313 days.

(21) Appl. No.: 13/588,540

(22) Filed: Aug. 17, 2012

(65) Prior Publication Data

US 2013/0057290 A1    Mar. 7, 2013

(30) Foreign Application Priority Data

Sep. 1, 2011 (KR) ................. 10-2011-0088527

(51) Int. Cl.
*G01R 31/36* (2006.01)
*H01M 10/48* (2006.01)
*H01M 10/42* (2006.01)

(52) U.S. Cl.
CPC .......... *G01R 31/3651* (2013.01); *H01M 10/42* (2013.01); *H01M 10/48* (2013.01); *H01M 10/486* (2013.01); *H01M 2010/4271* (2013.01)

(58) Field of Classification Search
CPC ............. G01R 31/006; G01R 31/2889; G01R 31/3658
USPC .......................... 324/400, 426–434; 361/159
See application file for complete search history.

(56) References Cited

U.S. PATENT DOCUMENTS

| | | | |
|---|---|---|---|
| 5,783,998 A * | 7/1998 | Nakajou et al. | 340/636.15 |
| 7,583,053 B2 * | 9/2009 | Kamohara | 320/106 |
| 8,143,854 B2 * | 3/2012 | Maegawa et al. | 320/125 |
| 2005/0046389 A1 | 3/2005 | Kim | |
| 2010/0010769 A1 * | 1/2010 | Houldsworth | 702/130 |
| 2010/0194341 A1 * | 8/2010 | Anupindi et al. | 320/118 |
| 2011/0169459 A1 * | 7/2011 | Chen et al. | 320/160 |

FOREIGN PATENT DOCUMENTS

| | | |
|---|---|---|
| JP | 2001-110459 A | 4/2001 |
| JP | 2003-157912 A | 5/2003 |
| JP | 2004-014228 A | 1/2004 |
| JP | 2010-086764 A | 4/2010 |
| KR | 10-2004-0041008 A | 5/2004 |
| KR | 10-2005-0035792 A | 4/2005 |
| KR | 10-2007-0105014 A | 10/2007 |

OTHER PUBLICATIONS

Korean Office Action dated Dec. 20, 2012 for Korean Patent Application No. KR 10-2011-0088527 which corresponds to captioned U.S. Appl. No. 13/588,540.

Korean Notice of Allowance dated Jun. 17, 2013 for Korean Patent Application No. KR 10-2011-0088527 which corresponds to captioned U.S. Appl. No. 13/588,540.

* cited by examiner

*Primary Examiner* — Melissa Koval
*Assistant Examiner* — Trung Nguyen
(74) *Attorney, Agent, or Firm* — Knobbe, Martens, Olson & Bear, LLP

(57) ABSTRACT

A battery pack and a method of controlling the battery pack are disclosed. In one embodiment, the battery pack includes a battery, a monitoring unit configured to monitor a voltage of the battery and provide a monitoring result, a memory storing a full-charge capacity (FCC) of the battery, and a controller configured to update the stored FCC when the monitoring result satisfies predetermined conditions during a falling period of the voltage.

17 Claims, 4 Drawing Sheets

| CURRENT<br>TEMPERATURE | A1 | A2 | ... | Ab |
|---|---|---|---|---|
| T1 | V11 | V12 | ... | V1b |
| T2 | V21 | V22 | ... | V2b |
| ⋮ | ⋮ | ⋮ | ... | ⋮ |
| Ta | Va1 | Va2 | ... | Vab |

BATTERY PACK AND METHOD OF CONTROLLING THE SAME

RELATED APPLICATIONS

This application claims the benefit of Korean Patent Application No. 10-2011-0088527, filed on Sep. 1, 2011, in the Korean Intellectual Property Office, the disclosures of which are incorporated herein in their entirety by reference.

BACKGROUND

1. Field

The described technology generally relates to a battery pack and a method of controlling the battery pack.

2. Description of the Related Technology

As portable electronic devices, for example, mobile phones, digital cameras, and laptop computers, are widely used, research is being actively conducted on batteries that supply the electric power for operation of such devices.

A battery pack generally contains a battery and a protective circuit that controls charging and discharging of the battery. During charging or discharging, defects may cause abnormal operation, and accordingly, the protective circuit includes various devices for stabilizing the battery pack.

SUMMARY

One inventive aspect is a battery pack capable of accurately updating a full-charge capacity (FCC) of a battery, and a method of controlling the battery pack.

Another aspect is a battery pack which includes: a battery; a monitoring unit for monitoring a voltage of the battery; a recording unit for storing a current full-charge capacity (FCC) of the battery; and a control unit updating the FCC of the battery when results of the monitoring satisfy predetermined conditions in a section where the voltage is descended.

The monitoring unit may monitor a temperature of the battery and an electric current flowing in the battery.

The control unit may not update the FCC when the predetermined conditions are satisfied when a discharging current is reduced or a discharging operation is terminated.

The control unit may update the FCC of the battery when the predetermined conditions are satisfied during a charging operation of the battery.

The predetermined conditions may be determined by the voltage, the electric current, and the temperature of the battery.

A table including the voltage, the electric current, and the temperature of the battery may be stored in order to determine whether the conditions are satisfied.

The control unit may not update the FCC of the battery when the monitoring results satisfy the predetermined conditions in a section where the voltage rises.

Another aspect is a method of controlling a battery pack, the method including: storing a current full-charge capacity (FCC) of a battery; monitoring a voltage of the battery; determining whether a result of the monitoring satisfies a predetermined condition; and updating the FCC of the battery when the monitoring result satisfies the predetermined condition in a section where the voltage of the battery is descended.

The method may further include: monitoring a temperature of the battery; and monitoring an electric current flowing in the battery.

The updating of the FCC of the battery may not be performed when the predetermined conditions are satisfied when a discharging current is reduced or when a discharging operation is terminated.

The updating of the FCC of the battery may be performed when the predetermined conditions are applied when a charging of the battery is terminated.

The predetermined conditions may be determined by the voltage, the electric current, and the temperature of the battery.

DETAILED DESCRIPTION

Figure 1:
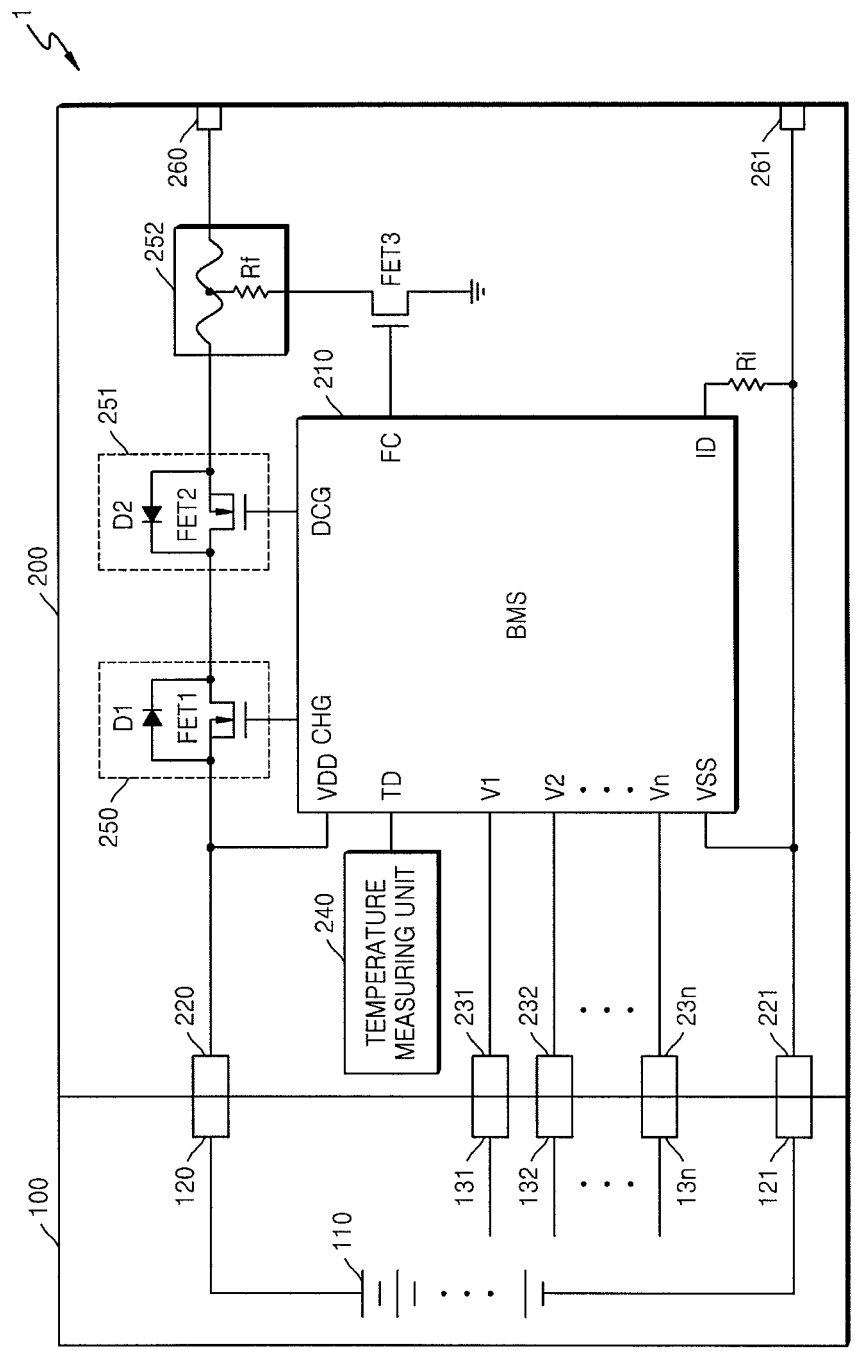
FIG. 1 is a circuit diagram of a battery pack according to an embodiment.

Generally, a secondary battery is repeatedly cycled via its charge and discharge operations. As the number of cycles increases, a film likely forms on an electrode plate or an internal resistance of an active material increases. Accordingly, the battery degrades and a full-charged capacity is gradually reduced. Typically, the lifespan of the battery is measured so as to determine whether the battery has to be replaced or not. One metric for determining a lifespan of the battery is a full-charge capacity (FCC), and when measured, accuracy is important to accurately determine lifespan.

Embodiments will be described with reference to the accompanying drawings, wherein like reference numerals refer to the like elements throughout. In this regard, the present embodiments may have different forms and should not be construed as being limited to the descriptions set forth herein. As used herein, the term "and/or" includes any and all combinations of one or more of the associated listed items. Expressions such as "at least one of," when preceding a list of elements, modify the entire list of elements and do not modify the individual elements of the list.

FIG. 1 is a circuit diagram of a battery pack 1 according to an embodiment

Referring to FIG. 1, the battery pack 1 may include a battery that stores electric power and a battery protection circuit 200 that controls operations of the battery 100. Depending on the embodiment, in FIG. 1, additional elements may be added to and/or others removed from the BMS 210, or two or more elements may be combined into a single element. For example, the battery protection circuit 200 may be incorporated into the battery pack 1, or may be separately provided and connected to the battery pack 1.

The battery 100 provides stored electric power to an electronic device, in which the battery pack 1 is mounted. In addition, when a charger is connected to the battery pack 1, the battery 100 may be charged by external electric power. The battery 100 may include at least one battery cell 110. The battery cell 110 may be a rechargeable secondary battery such as a nickel-cadmium battery, a lead storage battery, a nickel metal hydride (NiMH) battery, a lithium ion battery, or a lithium polymer battery.

The battery 100 is electrically connected to the battery protection circuit 200 via various terminals. Battery positive and negative electrode terminals 120 and 121 are electrically connected to protection circuit positive and negative electrode terminals 220 and 221, respectively. The above terminals are used as paths through which charging/discharging currents flow. In addition, output terminals 131 through 13$n$ of the battery 100 are electrically connected to input terminals 231 through 23$n$ of the battery protection circuit 200, and a plurality of output terminals 131 through 13$n$ may transfer intermediate voltages between the battery cells 110.

The battery protection circuit 200 controls charging and discharging operations of the battery 100. The battery protection circuit 200 may include a battery management system (BMS) 210, a temperature measuring unit 240, a charging control switch 250, a discharging control switch 251, and a fuse 252. The battery protection circuit 200 may include at least one additional first terminal electrically connected to the battery 100 and at least one additional second terminal electrically connected to an external device or a charger.

The BMS 210 controls the charging and discharging of the battery 100, and controls balancing of the battery cells 110 included in the battery 100. The BMS 210 may monitor at least one of i) voltages between the battery cells 110, ii) a temperature of the battery 100, and iii) the charging or discharging current, and determines a full-charge capacity (FCC) of the battery 100 based on the monitoring results. The FCC of the battery 100 will be described in detail with reference to FIG. 2.

The BMS 210 may include a plurality of terminals such as i) a power terminal (VDD) to which a power voltage is applied, ii) a ground terminal (VSS) to which a ground voltage is applied, iii) a temperature measuring terminal (TD) to which temperature measuring values are applied and iv) voltage measuring terminals V1 through Vn to which intermediate voltages of the battery 100 are applied. The BMS 210 may further include a charging control terminal (CHG), a discharging control terminal (DCG), a fuse control terminal (FC), and a current measuring terminal (ID).

The BMS 210 generates a charging control signal for controlling operations of the charging control switch 250 or a discharging control signal for controlling operations of the discharging control switch 251, when the battery pack 1 is defective. The BMS 210 outputs the generated charging or discharging control signal via the charging control terminal CHG or the discharging control terminal DCG.

The BMS 210 generates a fuse blocking signal that is applied to a fuse blocking switch FET3 via a fuse control terminal FC in order to block the fuse 252.

The BMS 210 measures the magnitude of the charging current or the discharging current flowing on a high current path by using a current measuring terminal ID.

In FIG. 1, the BMS 210 controls all of the components in the battery pack 1. However, BMS 210 may indirectly control such components, for example, by controlling an analog front end (not shown) that monitors states of the battery 100, such as an intermediate voltage or a temperature of the battery 100, and controls operations of the charging control switch 250 and the discharging control switch 251.

The temperature measuring unit 240 measures the temperature of the battery 100, and transfers the measured temperature to the BMS 210. The temperature measuring unit 240 may convert the measured temperature into a digital value, and after that, may transfer the digital value to the temperature measuring terminal TD of the BMS 210 through data communication. The temperature measuring unit 240 may sense the temperature of the battery 100 and provide a voltage or a resistance value corresponding to the sensed temperature to the terminal measuring terminal TD.

In FIG. 1, the temperature measuring unit 240 is formed in the battery protection circuit 200. However, the temperature measuring unit 240 may also be provided in the battery 100, for example, in order to accurately measure the temperature of the battery 100.

The charging control switch 250 blocks the charging current by the control of the BMS 210 when the battery pack 1 has a defect. The discharging control switch 251 blocks the discharging current by the control of the BMS 210 when the battery pack 1 has a defect.

The charging control switch 250 includes a field effect transistor (FET) FET1 and a parasitic diode D1. The FET1 is formed so as to block the flow of electric current from the first charging/discharging terminal 260 to the protection circuit positive electrode terminal 220 or from the protection circuit negative electrode terminal 221 to the second charging/discharging terminal 261. That is, the flow of charging current is blocked by the FET1. Here, the FET1 is formed such that the discharging current may flow through the parasitic diode D1.

The discharging control switch 251 includes an FET (FET2) and a parasitic diode D2. The FET2 is formed to restrict the current flow from the second charging/discharging terminal 261 to the protection circuit negative electrode terminal 221 or from the protection circuit positive electrode terminal 220 to the first charging/discharging terminal 260. That is, the FET2 blocks the flow of the discharging current. Here, the FET2 is formed such that the charging current may flow through the parasitic diode D2. Connecting directions of a source electrode and a drain electrode of the FET2 are opposite to those of a source electrode and a drain electrode in the FET1.

The charging control switch 250 and the discharging control switch 251 are switching devices, and are not limited to the FETs. That is, various devices that can perform switching functions may be used as the charging and discharging control switches 250 and 251.

The fuse 252 is formed on the high current path through which relatively large amount of electric current flows and is blown out when the battery pack 1 has a defect so that the charging current or the discharging current may not flow. A resistor Rf of the fuse 252 is connected between the high current path and a ground. When a current that is substantially equal to or greater than a predetermined magnitude flows through the resistor Rf, the fuse 252 is melt by heat generated from the resistor Rf so as to block the flow of the current.

In FIG. 1, the fuse 252 is electrically connected between the protection circuit positive electrode terminal 220 and the first charging/discharging terminal 260 via the switches 250 and 251. However, the fuse 252 may be electrically connected between the protection circuit negative electrode terminal 221 and the second charging/discharging terminal 261.

When a defect occurs in the battery pack 1, the flow of the charging current or the discharging current is blocked by the charging control switch 250 and/or the discharging control switch 251. However, when the defect of the battery pack 1 is not solved even when the charging control switch 250 and/or the discharging control switch 251 are controlled, the fuse 252 may be blown out to block the current flow permanently. In this situation, the battery pack 1 may not be usable permanently.

A fuse control switch FET3 allows the current to flow through the resistor Rf included in the fuse 252 so that the fuse 252 is blown out. The fuse control switch FET3 is formed between the fuse 252 and the ground, and is turned on when receiving a fuse blocking signal from the BMS 210, and thus, the current may flow through the resistor Rf. The fuse control switch FET3 may be a FET or other various switching devices.

The battery protection circuits 200 may include various terminals, such as the protection circuit positive electrode terminal 220, the protection circuit negative electrode terminal 221, the input terminals 231 through 23n, the first charging/discharging terminal 260, and the second charging/discharging terminal 261.

The input terminals 231 through 23n are connected to the output terminals 131 through 13n of the battery 100, and transfer the intermediate voltages of the battery 100 to voltage measuring terminals V1 through Vn of the BMS 210.

The first and second charging/discharging terminals 260 and 261 are electrically connected to an external device. Here, the external device may be an electronic device or a charger. The charging current is induced and the discharging current is output through the first charging/discharging terminal 260. Furthermore, the charging current is output and the discharging current is induced through the second charging/discharging terminal 261.

Hereinafter, a method of updating the FCC of the battery 100 will be described as follows.

Figure 2:
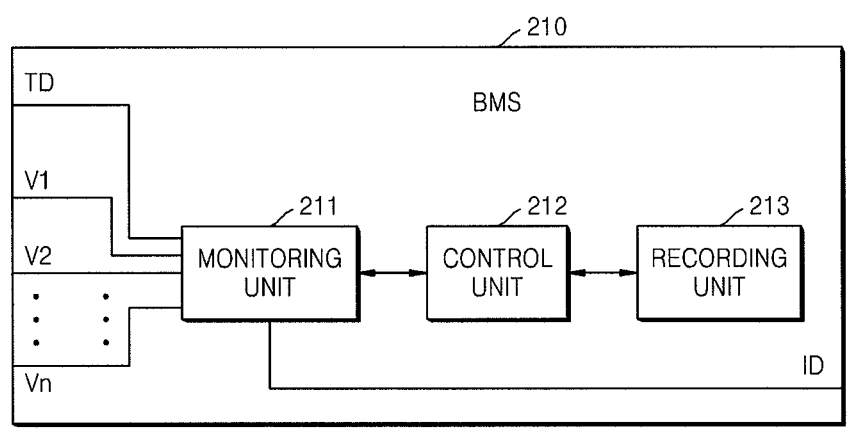
FIG. 2 is a diagram of a battery management unit according to an embodiment.

FIG. 2 is a diagram showing the BMS 210 according to an embodiment. Referring to FIG. 2, the BMS 210 may include a monitoring unit (or a measurement unit) 211, a control unit (or a controller) 212, and a recording unit (or a memory) 213. Depending on the embodiment, in FIG. 2, additional elements may be added to and/or others removed from the BMS 210, or two or more elements may be combined into a single element. For example, the monitoring unit 211 may be integrated into the control unit 212.

The monitoring unit 211 monitors a state of the battery 100. The monitoring unit 211 is electrically connected to the voltage measuring terminals V1 through Vn so as to measure intermediate voltages of the battery 100. In addition, the monitoring unit 211 is electrically connected to the temperature measuring terminal TD to measure the temperature of the battery 100. Also, the monitoring unit 211 is electrically connected to the current measuring terminal ID to measure the magnitude of the electric current flowing on the battery 100.

The monitoring unit 211 transfers the measuring results to the control unit 212. The monitoring unit 211 may measure at least one of the voltage, the current, and the temperature according to the command of the control unit 212. The monitoring unit 211 may repeatedly measure at least one of the voltage, the current, and the temperature according to a predetermined condition, for example, pre-set periods.

The control unit 212 receives the monitoring results including the voltage, the current, and the temperature values from the monitoring unit 211. The control unit 212 may compare the received monitoring results with a table representing relations between the voltage, the current, and the temperature, which is stored in the recording unit 213, in order to determine whether the FCC of the battery 100 has to be updated or not. Here, conditions for updating the FCC of the battery 100 will be described in more detail.

Figure 3:
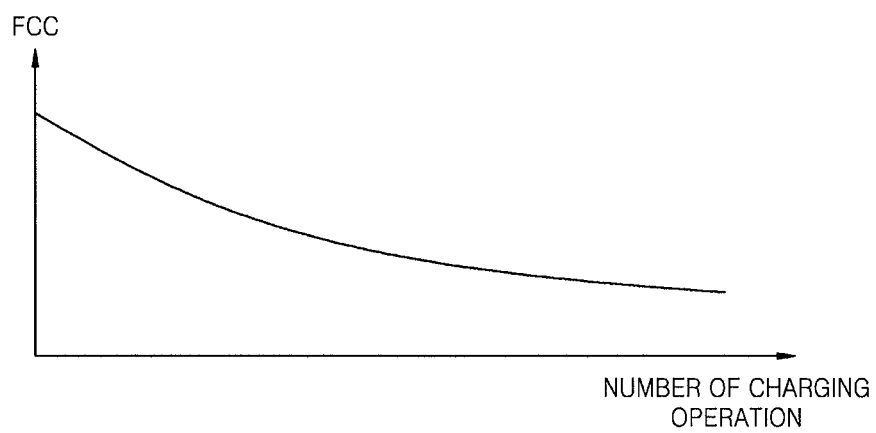
FIG. 3 is a graph showing an example relationship between the number of charging operations and a full-charge capacity (FCC) of the battery.

FIG. 3 is a graph showing an example relationship between the number of charging operations and the FCC of the battery 100. In FIG. 3, a horizontal axis denotes the number of charging operations, and a vertical axis denotes the FCC.

Referring to FIG. 3, as the usage of the battery 100 increases and the number of charging operations also increases, the FCC of the battery 100 is gradually reduced. In one embodiment, the current FCC of the battery 100 is checked accurately in order to determine whether the battery 100 has to be replaced or not by measuring the lifespan of the battery 100.

Figures 4, 5:
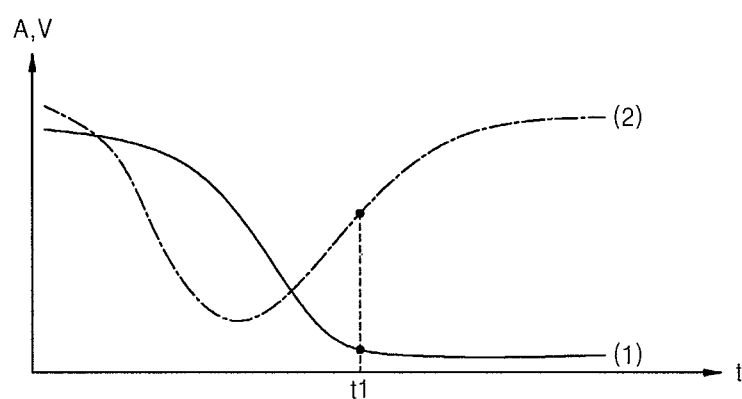
FIG. 4 is a table showing example conditions for updating the FCC of the battery.
FIG. 5 is a graph showing variations in a current and a voltage of the battery when a charged current is reduced.

FIG. 4 is a table showing example conditions of updating the FCC of the battery 100.

Referring to FIG. 4, the control unit 212 updates the FCC of the battery 100 when the monitored voltage, current, and temperature of the battery 100 match the corresponding value(s) shown in the table of FIG. 4. For example, if the temperature of the battery 100 is T1, the current of the battery A1, and the voltage of the battery 100 is V11, the control unit 212 updates the currently stored FCC data. In addition, the newly updated FCC data is stored in the recording unit 213.

The current value may be measured at a certain time point, for example, when the temperature and the voltage of the battery 100 are measured. However, the current that flows during the charging or discharging operation of the battery 100 may include noise components, and thus, updating the FCC based on the current value measured at the time point may cause an inaccurate result. Therefore, the current value may be an average of the current flowing in a certain period, for example, during about 20 ms.

On the other hand, while the discharging operation of the battery 100 is performed, the voltage is continuously reduced. However, when the discharging operation is discontinued, the discharging current is reduced, and the voltage of the battery 100 increases to a predetermined degree again due to characteristics of the battery cell 110. As described above, when at least one of the voltage, the current, and the temperature of the battery 100 matches one of the conditions shown in FIG. 4 while the discharging operation is stopped and the voltage of the battery 100 increases, the FCC of the battery 100 is updated.

FIG. 5 is a graph showing variations in the current and the voltage of the battery 100 when the charging current is reduced. A horizontal axis denotes time and a vertical axis denotes magnitudes of the voltage and the current.

Referring to FIG. 5, a graph (1) represents variation of the current according to the time. For example, the graph (1) shows that the discharging current is gradually reduced when the battery 100 stops the discharging operation.

A graph (2) represents variation of the voltage according to the time. During the discharging operation of the battery 100, the voltage of the battery 100 is reduced; however, the voltage of the battery 100 is increased again when the discharging operation is discontinued and the discharging current is reduced.

As described above, during rising of the voltage due to the termination of the discharging operation of the battery 100, the values of the voltage, the current, and the temperature at a time point t1 may satisfy one of the conditions shown in the table of FIG. 4.

The FCC of the battery 100 may not be updated based on a temporary voltage variation of the battery 100, since a voltage charging/discharging limit of the battery 100 may be incorrectly set and the measuring of the lifespan may be performed inaccurately. That is, update of the FCC of the battery 100 in the condition shown in FIG. 5 may be regarded as an abnormal update of the FCC.

Therefore, the control unit 212 may update the FCC of the battery 100 when the monitoring results of the battery 100 satisfy the predetermined conditions during a falling period of the voltage. Otherwise, the control unit 212 may update the FCC of the battery 100 when the monitoring results of the battery 100 satisfy the predetermined conditions during charging of the battery 100. On the other hand, the control unit 212 may not update the FCC of the battery 100 when the monitoring results of the battery 100 satisfy the predetermined conditions during a rising period of the voltage. Otherwise, the control unit 212 may not update the FCC of the battery 100 when the monitoring results of the battery 100 satisfy the predetermined conditions when the discharging current of the battery 100 is reduced or the discharging of the battery 100 is discontinued. Here, the predetermined conditions may refer to the example relationship among the voltage, the current, and the temperature of the battery 100, as shown in the table of FIG. 4.

In one embodiment, the control unit 212 updates the FCC of the battery 100 stored in the recording unit 213 with new data when the monitoring results of the battery 100 all satisfy the updating conditions.

The recording unit 213 stores the conditions for updating the FCC of the battery 100. For example, the conditions may include the voltages, the currents, and the temperatures of the battery 100 as shown in the table of FIG. 4. Here, parameters of the table may be determined according to the characteristics of the battery cells 110 included in the battery 100.

Also, the recording unit 213 stores the current FCC data of the battery 100, and updates the existing FCC data with new FCC data according to the command of the control unit 212.

TABLE 1

| condition for updating FCC according to a comparative example | Conditions for updating FCC according to an embodiment | Notes |
|---|---|---|
| 1. average current value<br>2. temperature<br>3. voltage<br>4. delayed time | 1. average current value<br>2. temperature<br>3. voltage<br>4. delayed time<br>5. voltage recovery | Prevent FCC from updating in a voltage recovery (rising) section due to reduction of discharging current |

Table 1 represents conditions for updating the FCC according to a comparative example and conditions for updating the FCC according to an embodiment. As shown in Table 1, according to an embodiment, the voltage recovery of the battery 100 is further considered. Here, the delayed time is a condition for maintaining the voltage value, the current value, and the temperature value for a predetermined time period.

The FCC of the battery 100 may not be updated during a rising period of the voltage of the battery 100, and thus, the FCC of the battery 100 may be updated more accurately.

Figure 6:
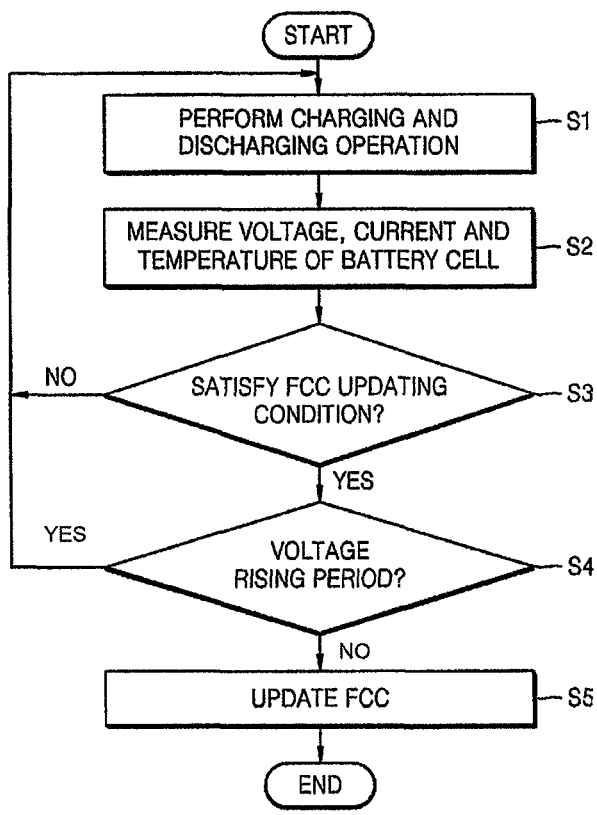
FIG. 6 is a flowchart illustrating a method of controlling a battery pack according to an embodiment.

FIG. 6 is a flowchart illustrating a method of controlling the battery pack 1 according to an embodiment. Depending on the embodiment, additional states may be added, others removed, or the order of the states changes in FIG. 6.

Referring to FIG. 6, the battery 100 performs the charging and discharging operations according to the control of the battery protection circuit 200 (S1). When the charger is electrically connected to the battery pack 1, the charging operation is performed. When the electronic device is connected to the battery pack 1, the discharging operation is performed.

The monitoring unit 211 monitors the battery 100 during the charging and discharging operations of the battery 100 to measure at least one of the voltage, the current, and the temperature of the battery 100 (S2).

The control unit 212 receives the monitoring results from the monitoring unit 211, and determines whether the monitoring results satisfy the FCC updating conditions of the battery 100 (S3). For example, the control unit 212 determines whether the measured values of the voltage, the current, and the temperature of the battery 100 matches the corresponding values stored in the table shown in FIG. 4.

If it is determined that the updating conditions are not satisfied in operation S3, the process returns to operation S1. In addition, the battery 100 repeatedly performs the charging and discharging operations, and the monitoring unit 211 performs the monitoring substantially continuously.

On the other hand, if it is determined that the updating conditions are satisfied in operation S3, it is determined whether the time point where the conditions are satisfied is included during a rising period of the voltage of the battery 100 (S4). For example, it is determined whether the discharging operation of the battery 100 is discontinued.

When it is determined that the voltage of the battery 100 rises in operation S4, the process returns to operation S1. On the other hand, when it is determined that the voltage of the battery 100 does not rise, the FCC of the battery 100 is updated and the updated FCC is stored in the recording unit 213 (S5).

As described above, according to at least one of the disclosed embodiments, the FCC of the battery 100 may be updated only when the monitoring results of the battery satisfy predetermined conditions during a falling period of the voltage. Since the FCC is not updated even when the updating conditions are satisfied during a rising period of the voltage of the battery 100, the FCC is updated more accurately.

Embodiments described herein should not be construed as limited to the particular shapes of regions illustrated herein but are to include deviations in shapes that result, for example, from manufacturing. For the conciseness of the specification, conventional electronic components, control systems, software, and other functional aspects of the systems may be omitted. In addition, line connections or connecting members between the components shown in the drawings exemplary show functional connections and/or physical or circuitry connections, and may be realized as various functional connections, physical connections, or circuit connections that are replaceable or addible.

While the above description has pointed out features of various embodiments, the skilled person will understand that various omissions, substitutions, and changes in the form and details of the device or process illustrated may be made without departing from the scope of the appended claims.

What is claimed is:

1. A battery pack, comprising:
    a battery;
    a monitoring unit, electrically connected to a voltage terminal of the battery, configured to monitor a voltage of the battery and provide a monitoring result;
    a memory storing a current full-charge capacity (FCC) of the battery; and
    a controller configured to update the stored FCC in the memory when the monitoring result satisfies predetermined conditions during a falling period of the voltage,
    wherein the controller is configured not to update the stored FCC during a rising period of the voltage, even if the monitoring result satisfies the predetermined conditions.

2. The battery pack of claim 1, wherein the monitoring unit is further configured to monitor a temperature of the battery and an electric current flowing in the battery.

3. The battery pack of claim 2, wherein the controller is configured not to update the FCC when a discharging current is reduced or a discharging operation is terminated, even if the predetermined conditions are satisfied.

4. The battery pack of claim 2, wherein the controller is further configured to update the stored FCC when the predetermined conditions are satisfied during a charging operation of the battery.

5. The battery pack of claim 2, wherein the predetermined conditions represent a predetermined relationship among the voltage, the electric current, and the temperature of the battery.

6. The battery pack of claim 2, wherein the memory stores a table including certain predetermined combinations of possible values of the voltage, the electric current, and the temperature of the battery, and wherein the controller is further configured to determine whether the conditions are satisfied based on the table.

7. A method of controlling a battery pack, the method comprising:
storing a current full-charge capacity (FCC) of a battery;
monitoring a voltage of the battery via an electrical connection to a voltage terminal of the battery;
determining whether a result of the monitoring satisfies a predetermined condition; and
updating the stored FCC when the monitoring result satisfies the predetermined condition during a falling period of the voltage, wherein the stored FCC is not updated during a rising period of the voltage, even if the monitoring result satisfies the predetermined conditions.

8. The method of claim 7, further comprising:
monitoring a temperature of the battery; and
monitoring an electric current flowing in the battery.

9. The method of claim 8, wherein the predetermined condition represents a predetermined relationship among the voltage, the electric current, and the temperature of the battery.

10. The method of claim 7, wherein the updating of the FCC of the battery is not performed when a discharging current is reduced or when a discharging operation is terminated, even if the predetermined condition is satisfied.

11. The method of claim 7, wherein the updating of the FCC of the battery is performed when the predetermined condition is satisfied when a charging of the battery is terminated.

12. A battery controlling apparatus, comprising:
a measurement unit, having at least an electrical connection to the voltage terminal of the battery, configured to measure physical or electrical characteristics of a battery, wherein the measurement unit is configured to measure a voltage of the battery;
a memory storing a current full-charge capacity (FCC) of the battery and a predetermined relationship among the physical or electrical characteristics of the battery; and
a controller configured to renew the stored FCC with a new FCC based on comparison of the measured characteristics of the battery and the predetermined relationship, wherein the controller is configured not to renew the stored FCC with a new FCC during a rising period of the voltage, even if the measured voltage matches a corresponding voltage value stored in the memory.

13. The battery controlling apparatus of claim 12, wherein the physical or electrical characteristics of the battery comprises at least one of: voltage, temperature and current.

14. The battery controlling apparatus of claim 12, wherein the controller is configured to renew the stored FCC with a new FCC when the measured voltage matches a corresponding voltage value stored in the memory during a falling period of the voltage.

15. The battery controlling apparatus of claim 12, wherein the controller is configured not to renew the FCC when a discharging current is reduced or a discharging operation is terminated, even if the measured characteristics of the battery match the corresponding value stored in the memory.

16. The battery controlling apparatus of claim 12, wherein the controller is further configured to renew the stored FCC with a new FCC when the measured characteristics matches a corresponding value stored in the memory during a charging. operation of the battery.

17. The battery controlling apparatus of claim 12, wherein the measurement unit is incorporated into the controller.

* * * * *